US008841147B2

(12) United States Patent
Wei et al.

(10) Patent No.: US 8,841,147 B2
(45) Date of Patent: Sep. 23, 2014

(54) METHOD FOR MAKING LIGHT EMITTING DIODE

(71) Applicants: Tsinghua University, Beijing (CN); Hon Hai Precision Industry Co., Ltd., New Taipei (TW)

(72) Inventors: Yang Wei, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 55 days.

(21) Appl. No.: 13/729,224

(22) Filed: Dec. 28, 2012

(65) Prior Publication Data

US 2014/0065742 A1   Mar. 6, 2014

(30) Foreign Application Priority Data

Mar. 28, 2012  (CN) .......................... 2012 1 0085267

(51) Int. Cl.
*H01L 21/00* (2006.01)
*H01L 33/32* (2010.01)
*H01L 33/00* (2010.01)
*H01L 33/58* (2010.01)

(52) U.S. Cl.
CPC ............ *H01L 33/32* (2013.01); *H01L 33/0075* (2013.01); *H01L 33/58* (2013.01)
USPC .......................................................... 438/29

(58) Field of Classification Search
USPC .......................................................... 438/29
See application file for complete search history.

(56) References Cited

U.S. PATENT DOCUMENTS

| 8,384,111 | B2 * | 2/2013 | Tadatomo et al. | 257/98 |
| 8,546,839 | B2 * | 10/2013 | Wei et al. | 257/99 |
| 8,558,217 | B2 * | 10/2013 | Wei et al. | 257/13 |
| 8,569,736 | B2 * | 10/2013 | Wei et al. | 257/13 |
| 8,659,045 | B2 * | 2/2014 | Tsai et al. | 257/99 |
| 2002/0037599 | A1 * | 3/2002 | Ishida et al. | 438/29 |
| 2008/0142824 | A1 * | 6/2008 | Chen et al. | 257/98 |
| 2009/0127575 | A1 * | 5/2009 | Horng et al. | 257/98 |
| 2009/0128022 | A1 * | 5/2009 | Shim et al. | 313/504 |
| 2010/0084664 | A1 * | 4/2010 | Wang | 257/78 |
| 2010/0181896 | A1 | 7/2010 | Lee et al. | |
| 2011/0052477 | A1 | 3/2011 | Yao et al. | |
| 2011/0084307 | A1 * | 4/2011 | Miki et al. | 257/103 |

(Continued)

FOREIGN PATENT DOCUMENTS

TW   200833598   8/2008

*Primary Examiner* — Yu-Hsi D Sun
*Assistant Examiner* — Grant Withers
(74) *Attorney, Agent, or Firm* — Novak Druce Connolly Bove + Quigg LLP

(57) ABSTRACT

A method for making a light emitting diode includes the following steps. A first epitaxial substrate having a first epitaxial growth surface is provided. A carbon nanotube layer is placed on the first epitaxial growth surface. An intrinsic semiconductor layer is grown on the first epitaxial growth surface epitaxially. A second epitaxial substrate is formed by removing the carbon nanotube layer, wherein the second epitaxial substrate has a second epitaxial growth surface. A first semiconductor layer, an active layer and a second semiconductor layer are grown on the second epitaxial growth surface in that order. A part of the first semiconductor layer is exposed by etching a part of the active layer and the second semiconductor layer. A first electrode is applied on the first semiconductor layer and a second electrode is applied on the second semiconductor layer.

17 Claims, 9 Drawing Sheets

(56) References Cited

U.S. PATENT DOCUMENTS

| | | | |
|---|---|---|---|
| 2011/0198639 A1* | 8/2011 | Eberhard et al. | 257/98 |
| 2012/0043566 A1* | 2/2012 | Wu et al. | 257/94 |
| 2012/0138980 A1* | 6/2012 | Kuo et al. | 257/94 |
| 2012/0175742 A1* | 7/2012 | Wei et al. | 257/618 |
| 2012/0178243 A1* | 7/2012 | Wei et al. | 438/478 |
| 2012/0178244 A1* | 7/2012 | Wei et al. | 438/478 |
| 2012/0178245 A1* | 7/2012 | Wei et al. | 438/478 |
| 2012/0178248 A1* | 7/2012 | Wei et al. | 438/479 |
| 2012/0273754 A1* | 11/2012 | Wei et al. | 257/13 |
| 2012/0273755 A1* | 11/2012 | Wei et al. | 257/13 |
| 2012/0273818 A1* | 11/2012 | Wei et al. | 257/98 |
| 2012/0276666 A1* | 11/2012 | Wei et al. | 438/22 |
| 2012/0276669 A1* | 11/2012 | Wei et al. | 438/29 |
| 2013/0005060 A1* | 1/2013 | Lo et al. | 438/29 |
| 2013/0224893 A1* | 8/2013 | Wei et al. | 438/29 |
| 2013/0255565 A1* | 10/2013 | Wei et al. | 117/58 |
| 2013/0255566 A1* | 10/2013 | Wei et al. | 117/58 |
| 2013/0260487 A1* | 10/2013 | Wei et al. | 438/22 |
| 2013/0260493 A1* | 10/2013 | Jin et al. | 438/29 |
| 2013/0260502 A1* | 10/2013 | Wei et al. | 438/47 |
| 2013/0313588 A1* | 11/2013 | Kojima et al. | 257/98 |
| 2013/0313596 A1* | 11/2013 | Fu et al. | 257/98 |
| 2014/0014901 A1* | 1/2014 | Wei et al. | 257/13 |
| 2014/0017836 A1* | 1/2014 | Wei et al. | 438/32 |
| 2014/0070257 A1* | 3/2014 | Wei et al. | 257/98 |
| 2014/0091323 A1* | 4/2014 | Wei et al. | 257/76 |
| 2014/0091436 A1* | 4/2014 | Wei et al. | 257/618 |
| 2014/0094022 A1* | 4/2014 | Wei et al. | 438/478 |
| 2014/0134773 A1* | 5/2014 | Jain et al. | 438/44 |

* cited by examiner

METHOD FOR MAKING LIGHT EMITTING DIODE

CROSS-REFERENCE TO RELATED APPLICATIONS

This application claims all benefits accruing under 35 U.S.C. §119 from China Patent Application No. 201210085267.6 filed on Mar. 28, 2012 in the China Intellectual Property Office, disclosure of which is incorporated herein by reference. This application is related to applications entitled, Ser. No. 13/593,602 "METHOD FOR MAKING EPITAXIAL STRUCTURE", filed Aug. 24, 2012; Ser. No. 13/593,607 "METHOD FOR MAKING EPITAXIAL STRUCTURE", filed Aug. 24, 2012; Ser. No. 13/729,268 "METHOD FOR MAKING LIGHT EMITTING DIODE", filed Dec. 28, 2012; Ser. No. 13/647,443 "METHOD FOR MAKING EPITAXIAL BASE", filed Oct. 9, 2012; Ser. No. 13/647,444 "EPITAXIAL BASE", filed Oct. 9, 2012; Ser. No. 13/647,445 "EPITAXIAL STRUCTURE", filed Oct. 9, 2012.

BACKGROUND

1. Technical Field

The present disclosure relates to a light emitting diode (LED) and a method for making the same.

2. Description of Related Art

LEDs are semiconductors that convert electrical energy into light. Compared to conventional light sources, LEDs have higher energy conversion efficiency, higher radiance (i.e., they emit a larger quantity of light per unit area), longer lifetime, higher response speed, and better reliability. At the same time, LEDs generate less heat. Therefore, LED modules are widely used as light sources in optical imaging systems, such as displays, projectors, and so on.

A conventional method of making the LEDs includes the following steps. A buffer layer, a first semiconductor layer, an active layer, and a second semiconductor layer are deposited on a substrate by a metal organic chemical vapor deposition (MOCVD) method. The second semiconductor layer and the active layer are etched via an inductance-coupling plasma etch process, thereby exposing a surface of the first semiconductor layer. A first electrode is deposited on a top surface of the first semiconductor layer via an electron beam evaporation process. A second electrode is formed on the second semiconductor layer via the electron beam evaporation process. To improve the light extraction efficiency of the LEDs, the second semiconductor is etched via the inductance-coupling plasma etch process to roughen a top surface. The roughened top surface is defined as the light extraction surface. However, in the above method, etching the light extraction surface to roughen the top surface thereof is a complex manufacturing process and has a high manufacturing cost. Furthermore, during the etching process, the lattice structure of the semiconductor layer may be destroyed.

What is needed, therefore, is a light emitting diode that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present epitaxial structures and methods for making the same.

Figure 1:
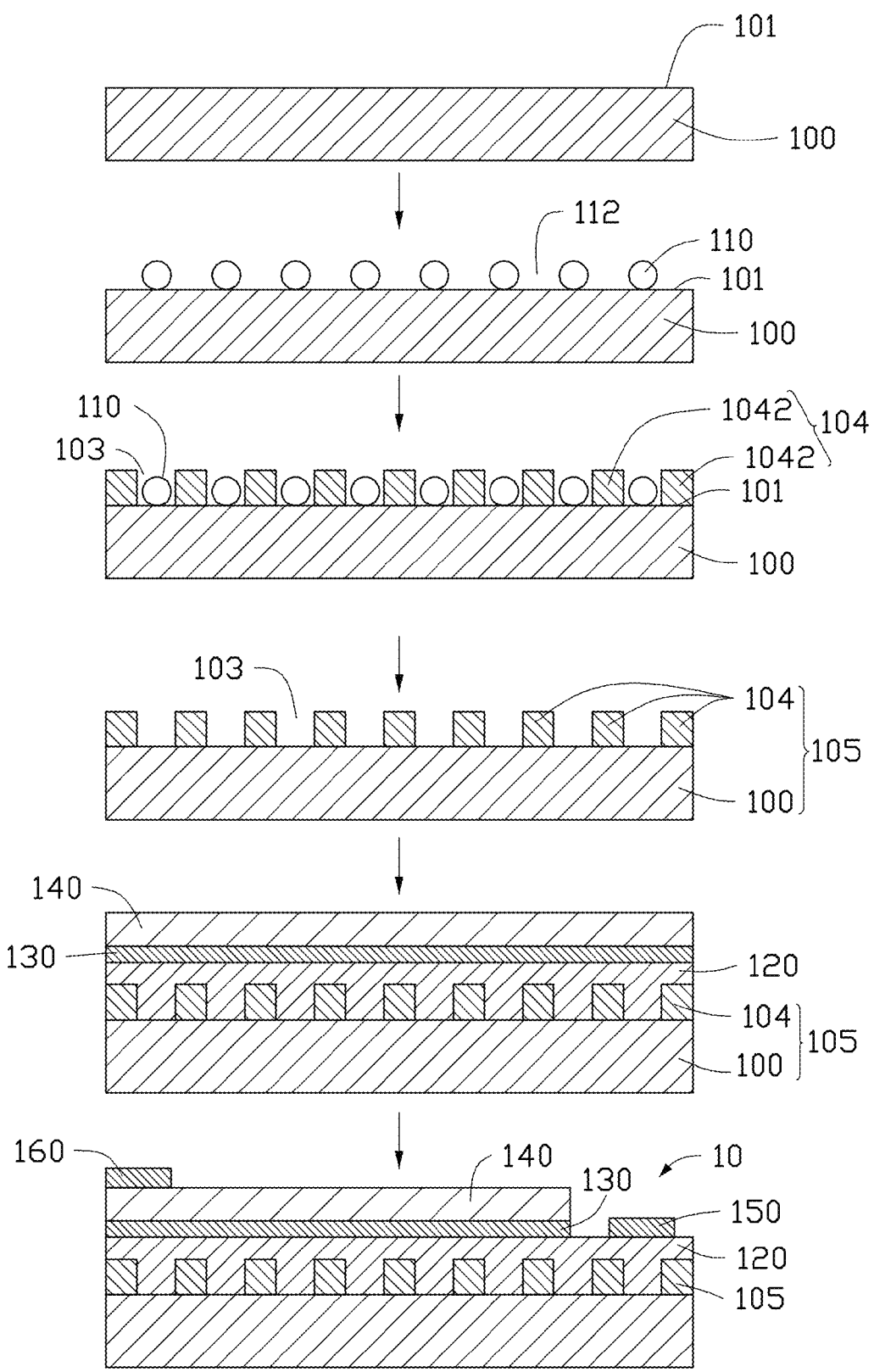
FIG. 1 is a flowchart of one embodiment of a method for making an LED.

Referring to FIG. 1, a method for making a light emitting diode (LED) 10 of one embodiment includes the following steps:

step (11), providing a first epitaxial substrate 100 having a first epitaxial growth surface 101;

step (12), placing a carbon nanotube layer 110 on the first epitaxial growth surface 101 of the first epitaxial substrate 100;

step (13), epitaxially growing an intrinsic semiconductor layer 104 on the first epitaxial growth surface 101, wherein the intrinsic semiconductor layer 104 is a discontinuous epitaxial layer comprising a plurality of nanostructures spaced from each other;

step (14), forming a second epitaxial substrate 105 by removing the carbon nanotube layer 110, wherein the second epitaxial substrate 105 has a patterned surface defined as a second epitaxial growth surface;

step (15), growing a first semiconductor layer 120, an active layer 130 and a second semiconductor layer 140 on the second epitaxial growth surface in that order, wherein a surface of the first semiconductor layer 120 contacting the second epitaxial substrate 105 is patterned and engages the second epitaxial growth surface of the second epitaxial substrate 105;

step (16), exposing a part of the first semiconductor layer 120 by etching a part of the active layer 130 and the second semiconductor layer 140; and step (17), applying a first electrode 150 on the first semiconductor layer 120 and applying a second electrode 160 on the second semiconductor layer 140.

In step (11), the first epitaxial growth surface 101 can be used to grow the intrinsic semiconductor layer 104 and the first semiconductor layer 120. The first epitaxial growth surface 101 is a clean and smooth surface. The first epitaxial substrate 100 can be a single-layer structure or a multi-layer structure. If the first epitaxial substrate 100 is a single-layer structure, the first epitaxial substrate 100 can be a single crystal structure having a crystal face defined as the first epitaxial growth surface 101. The material of the first epitaxial substrate 100 can be SOI (Silicon on insulator), LiGaO$_2$, LiAlO$_2$, Al$_2$O$_3$, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn or GaP:N. If the first epitaxial substrate 100 is a multi-layer structure, the first epitaxial substrate 100 should include at least one layer having the crystal face. The material of the first epitaxial substrate 100 can be selected according to the material of the intrinsic semiconductor layer 104 and the first semiconductor layer 120. The first epitaxial substrate 100, the first semiconductor layer 120, and the intrinsic semiconductor layer 104 should have a small lattice mismatch and a thermal expansion mismatch. The size, thickness, and shape of the first epitaxial substrate 100 can be selected according to need. In one embodiment, the first epitaxial substrate 100 is a sapphire substrate.

In step (12), the carbon nanotube layer 110 is located on the first epitaxial growth surface 101. The carbon nanotube layer 110 and the first epitaxial growth surface 101 are in contact with each other. The carbon nanotube layer 110 comprises a plurality of carbon nanotubes. The extending direction of the carbon nanotubes is substantially parallel to the surface of the carbon nanotube layer 110 and the first epitaxial growth surface 101.

The thickness of the carbon nanotube layer 110 can be in a range from about 10 nanometers to about 100 micrometers. For example, the thickness of the carbon nanotube layer 110 can be about 100 nanometers, about 200 nanometers, or about 1 micrometer. In one embodiment, the thickness of the carbon nanotube layer 110 is about 100 nanometers. The carbon nanotube layer 110 includes a plurality of carbon nanotubes. The carbon nanotubes on the first epitaxial growth surface 101 can be single-walled, double-walled, or multi-walled carbon nanotubes. The length and diameter of the carbon nanotubes can be selected according to need.

The carbon nanotube layer 110 forms a pattern. The term "patterned structure" is that the carbon nanotube layer 110 defines the plurality of apertures 112. The plurality of apertures 112 can be dispersed uniformly. The plurality of apertures 112 extend along a direction substantially perpendicular to the first epitaxial growth surface 101. Part of the first epitaxial growth surface 101 can be exposed from the plurality of apertures 112 after the carbon nanotube layer 110 is placed on the first epitaxial growth surface 101, thus, the intrinsic semiconductor layer 104 can epitaxial grown through the plurality of apertures 112.

Each of the plurality of apertures 112 can be a hole defined by several adjacent carbon nanotubes, or a gap defined by two substantially parallel carbon nanotubes and extending substantially along axial directions of the carbon nanotubes. The plurality of apertures 112 which are hole-shaped and the plurality of apertures 112 which are gap-shaped can exist in the patterned carbon nanotube layer 110 at the same time. Hereafter, the size of each of the plurality of apertures 112 is the diameter of the hole or width of the gap. The sizes of the plurality of apertures 112 can be different. The average size of the plurality of apertures 112 can be in a range from about 10 nanometers to about 300 micrometers. For example, the sizes of the plurality of apertures 112 can be about 10 nanometers, about 1 micrometer, about 10 micrometers, about 80 micrometers, or about 120 micrometers. The smaller the sizes of the plurality of apertures 112, the less dislocation defects will occur during the process of growing the first semiconductor layer 120. In one embodiment, the sizes of the plurality of apertures 112 are in a range from about 10 nanometers to about 10 micrometers. A dutyfactor of the first epitaxial growth surface 101 is an area ratio between the first epitaxial growth surface 101 which is sheltered by the carbon nanotube layer 110 and the first epitaxial growth surface 101 which is exposed by the plurality of apertures 112. The dutyfactor of the first epitaxial growth surface 101 can be in a range from about 1:100 to about 100:1. For example, the duty factor of the carbon nanotube layer 110 can be about 1:10, about 1:2, about 1:4, about 4:1, about 2:1, or about 10:1. In one embodiment, the dutyfactor of the carbon nanotube layer 110 is in a range from about 1:4 to about 4:1.

The carbon nanotubes of the carbon nanotube layer 110 can be orderly arranged to form an ordered carbon nanotube structure or disorderly arranged to form a disordered carbon nanotube structure. The term 'disordered carbon nanotube structure' includes, but is not limited to, a structure wherein the carbon nanotubes are arranged along many different directions, and the aligning directions of the carbon nanotubes are random. The number of the carbon nanotubes arranged along each different direction can be almost the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure wherein the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes of the carbon nanotube layer 110 are arranged along the direction substantially parallel to the surface of the carbon nanotube layer 110 to obtain a pattern having greater light transmission. After placement on the first epitaxial growth surface 101, the carbon nanotubes of the carbon nanotube layer 110 can be arranged along a direction substantially parallel to the first epitaxial growth surface 101. The carbon nanotubes in the ordered carbon nanotube structure can also be arranged along the crystallographic orientation of the first epitaxial substrate 100 or along a direction which forms an angle with the crystallographic orientation of the first epitaxial substrate 100.

The carbon nanotube layer 110 can be formed on the first epitaxial growth surface 101 by chemical vapor deposition (CVD), transfer printing a preformed carbon nanotube film, or filtering and depositing a carbon nanotube suspension. In one embodiment, the carbon nanotube layer 110 is a free-standing structure and can be drawn from a carbon nanotube array. The term "free-standing structure" means that the carbon nanotube layer 110 can sustain the weight of itself when it is hoisted by a portion thereof without any significant damage to its structural integrity. Thus, the carbon nanotube layer 110 can be suspended by two spaced supports. The carbon nanotube layer 110 which is free-standing can be laid on the first epitaxial growth surface 101 directly and easily.

The carbon nanotube layer 110 can be a substantially pure structure of carbon nanotubes, with few impurities and chemical functional groups. The carbon nanotube layer 110 can also be a composite including a carbon nanotube matrix and non-carbon nanotube materials. The non-carbon nanotube materials can be graphite, graphene, silicon carbide, boron nitride, silicon nitride, silicon dioxide, diamond, amorphous carbon, metal carbides, metal oxides, or metal nitrides. The non-carbon nanotube materials can be coated on the carbon nanotubes of the carbon nanotube layer 110. In one embodiment, the non-carbon nanotube materials are coated on the carbon nanotubes of the carbon nanotube layer 110 so that the carbon nanotubes can have greater diameters and the plurality of apertures 112 can be smaller. The non-carbon nanotube materials can be deposited on the carbon nanotubes of the carbon nanotube layer 110 by CVD or physical vapor deposition (PVD), such as sputtering.

Furthermore, the carbon nanotube layer 110 can be treated with an organic solvent after being placed on the first epitaxial growth surface 101 so that the carbon nanotube layer 110 can be attached on the first epitaxial growth surface 101 firmly. Specifically, the organic solvent can be applied to entire surface of the carbon nanotube layer 110 or an entirety of the carbon nanotube layer 110 can be immersed in an organic solvent. The organic solvent can be volatile, such as ethanol, methanol, acetone, dichloroethane, chloroform, or mixtures thereof. In one embodiment, the organic solvent is ethanol.

The carbon nanotube layer 110 can comprise a carbon nanotube film, a plurality of carbon nanotube wires, or combination thereof. In one embodiment, the carbon nanotube layer 110 can include a single carbon nanotube film or two or more carbon nanotube films stacked together. Thus, the thickness of the carbon nanotube layer 110 can be controlled by the number of the stacked carbon nanotube films. The number of the stacked carbon nanotube films can be in a range from about 2 to about 100. For example, the number of the stacked carbon nanotube films can be 10, 30, or 50. In one embodiment, the carbon nanotube layer 110 can include a layer of substantially parallel and spaced carbon nanotube wires. The carbon nanotube layer 110 can also include a plurality of carbon nanotube wires crossed or weaved together to form a carbon nanotube net. The distance between two adjacent substantially parallel and spaced carbon nanotube wires can be in a range from about 0.1 micrometers to about 200 micrometers. In one embodiment, the distance between two adjacent substantially parallel and spaced carbon nanotube wires is in a range from about 10 micrometers to about 100 micrometers. The gap between two adjacent substantially parallel carbon nanotube wires is defined as one of the plurality of apertures 112. The size of each of the plurality of apertures 112 can be controlled by controlling the distance between two adjacent substantially parallel and spaced carbon nanotube wires. The length of the gap between two adjacent substantially parallel carbon nanotube wires can be equal to the length of the carbon nanotube wire. It is understood that any carbon nanotube structure described can be used with all embodiments.

Figure 2:
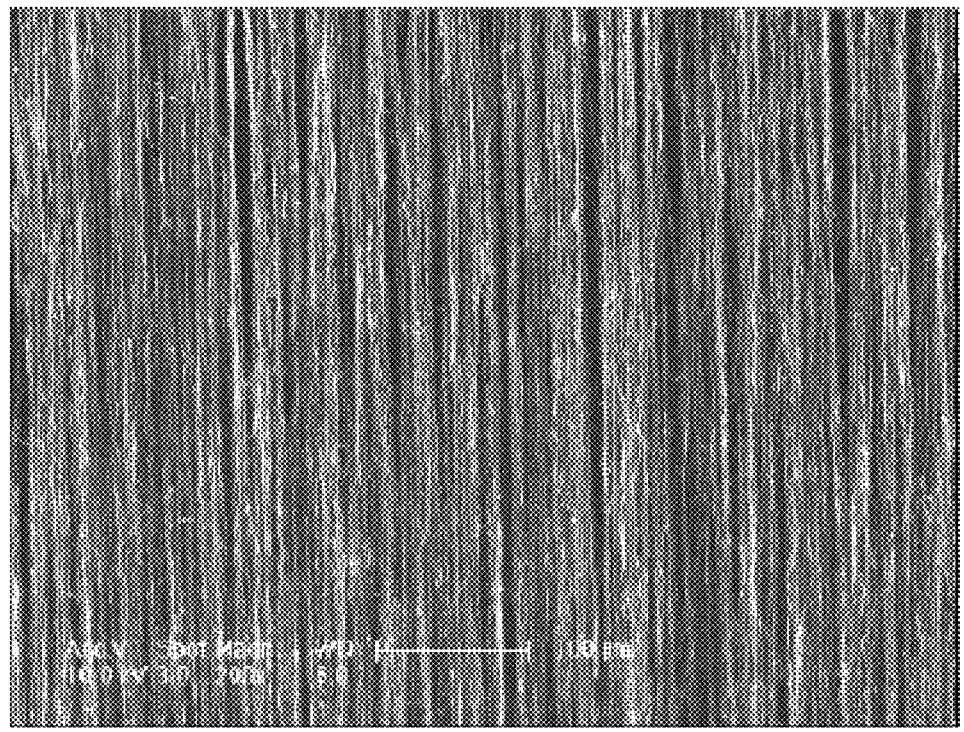
FIG. 2 is a Scanning Electron Microscope (SEM) image of a drawn carbon nanotube film.
Figure 3:
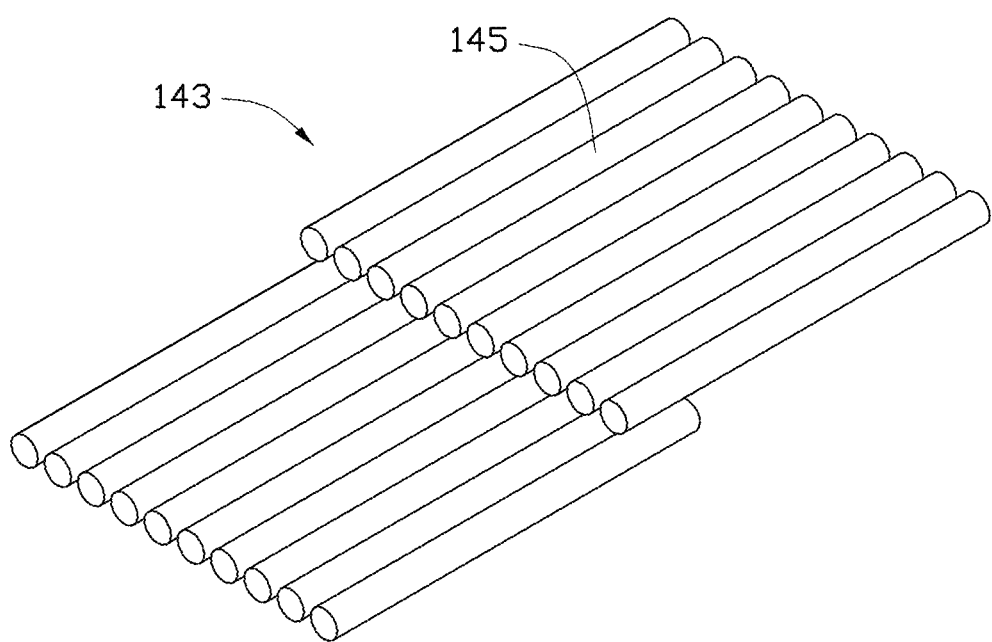
FIG. 3 is a schematic view of one embodiment of a carbon nanotube segment of the drawn carbon nanotube film of FIG. 2.

In one embodiment, the carbon nanotube layer 110 includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIGS. 2 to 3, each of the plurality of carbon nanotube segments 113 includes a plurality of carbon nanotubes 115 similarly oriented at an orientation direction and axially combined by van der Waals attractive force therebetween. Each drawn carbon nanotube film includes a plurality of carbon nanotube segments 113. Each of the plurality of carbon nanotube segments is successively oriented along the orientation direction, and wherein an end of one of the plurality of carbon nanotube segments is joined to an end of another one of the plurality of carbon nanotube segments by van der Waals attractive force therebetween. As can be seen in FIG. 2, some variations can occur in the drawn carbon nanotube film. Carbon nanotubes 115 of the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 1 nanometer to about 100 micrometers. The drawn carbon nanotube film can be attached to the first epitaxial growth surface 101 directly.

Figure 4:
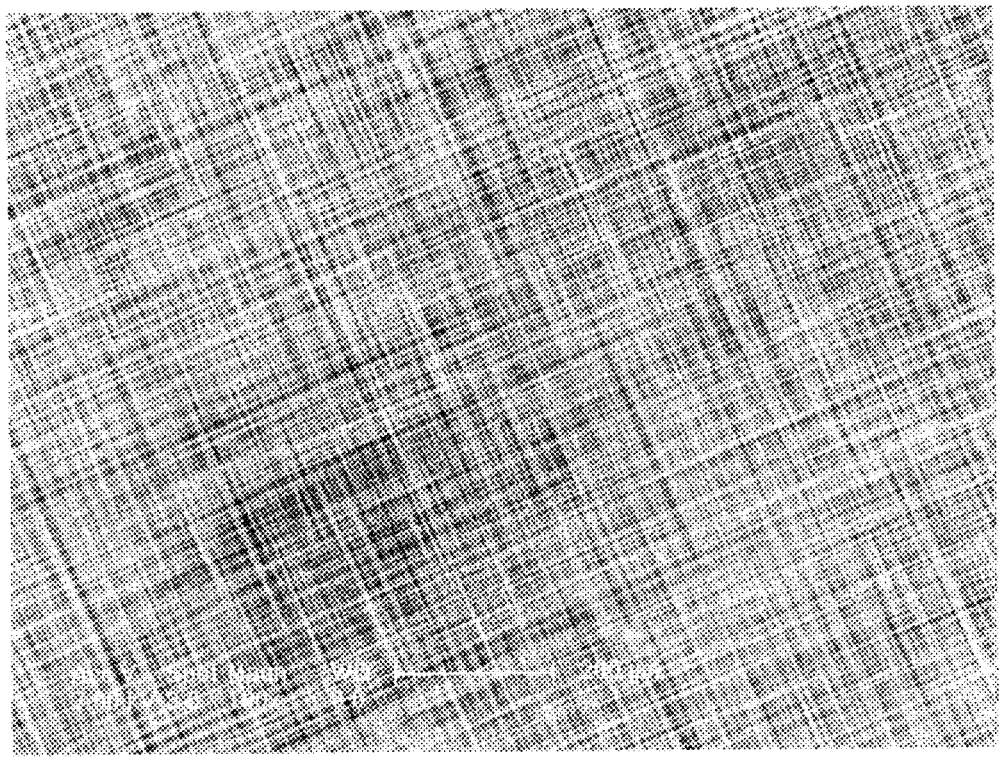
FIG. 4 is an SEM image of one embodiment of a plurality of carbon nanotube films stacked in a cross order.

Referring to FIG. 4, the carbon nanotube layer 110 can include at least two stacked drawn carbon nanotube films. In other embodiments, the carbon nanotube layer 110 can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degrees, a plurality of micropores is defined by the carbon nanotube layer 110. Stacking the carbon nanotube films will also add to the structural integrity of the carbon nanotube layer 110.

A step of heating the drawn carbon nanotube film can be performed to decrease the thickness of the drawn carbon nanotube film. The drawn carbon nanotube film can be partially heated by a laser or microwave. The thickness of the drawn carbon nanotube film can be reduced because some of the carbon nanotubes will be oxidized. In one embodiment, the drawn carbon nanotube film is irradiated by a laser device in an atmosphere comprising of oxygen therein. The power density of the laser is greater than $0.1 \times 10^4$ watts per square meter. The drawn carbon nanotube film can be heated by fixing the drawn carbon nanotube film and moving the laser device at a substantially uniform speed to irradiate the drawn carbon nanotube film. When the laser irradiates the drawn carbon nanotube film, the laser is focused on the surface of the drawn carbon nanotube film to form a laser spot. The diameter of the laser spot ranges from about 1 micron to about 5 millimeters. In one embodiment, the laser device is carbon dioxide laser device, the power of the laser device is about 30 watts, the wavelength of the laser is about 10.6 micrometers, the diameter of the laser spot is about 3 millimeters, the velocity of the laser movement is less than 10 millimeters per second, and the power density of the laser is about $0.053 \times 10^{12}$ watts per square meter.

Figure 5:
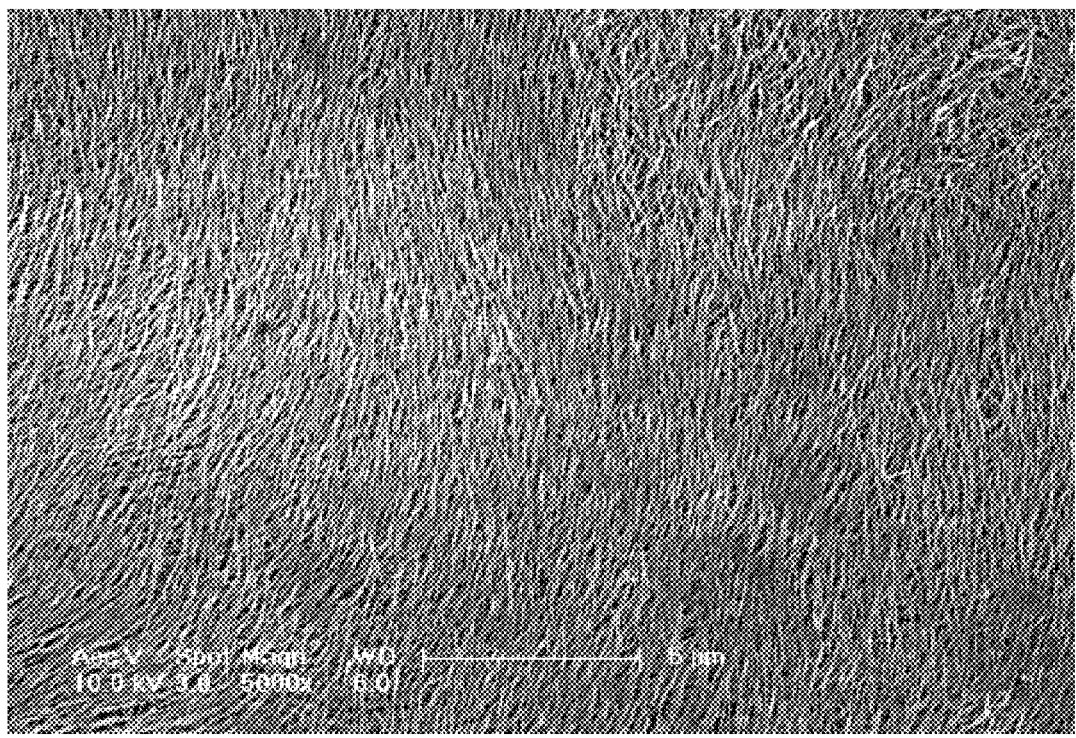
FIG. 5 is an SEM image of one embodiment of a pressed carbon nanotube film.

In another embodiment, the carbon nanotube layer 110 can include a pressed carbon nanotube film. Referring to FIG. 5, the pressed carbon nanotube film can be a free-standing carbon nanotube film. The carbon nanotubes in the pressed carbon nanotube film are arranged along a same direction or arranged along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is about 0 degrees to approximately 15 degrees. The greater the pressure applied, the smaller the angle formed. If the carbon nanotubes in the pressed carbon nanotube film are arranged along different directions, the carbon nanotube layer 110 can be isotropic.

Figure 6:
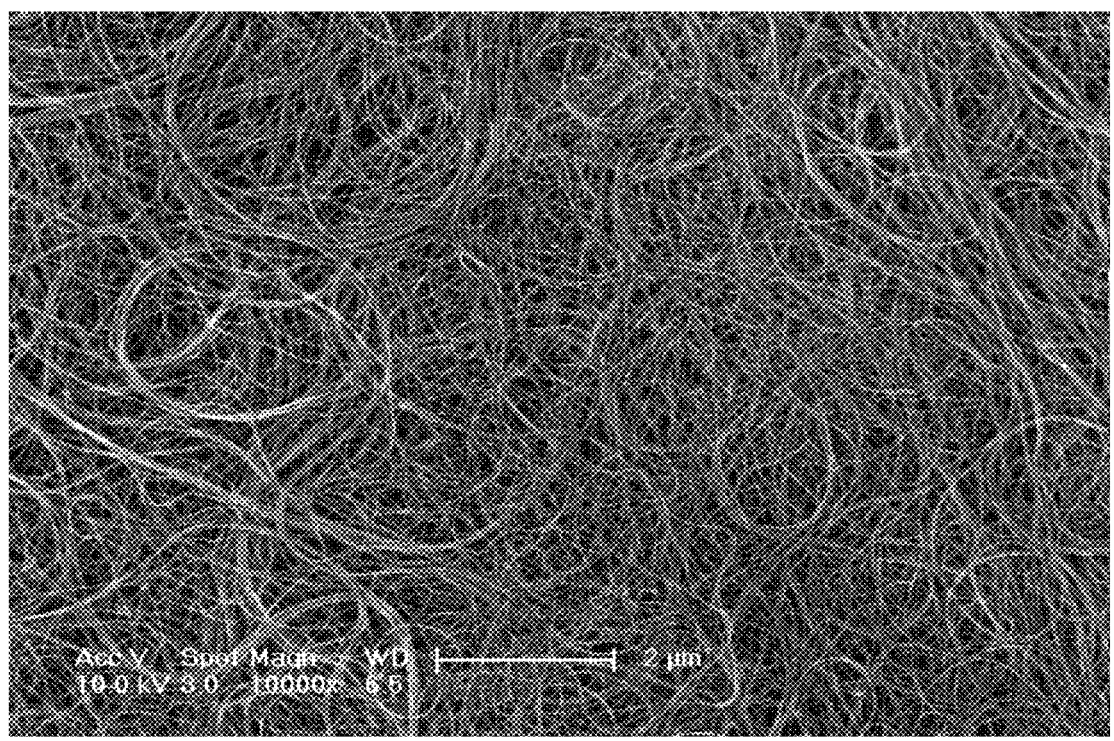
FIG. 6 is an SEM image of one embodiment of a flocculated carbon nanotube film.

In another embodiment, the carbon nanotube layer 110 includes a flocculated carbon nanotube film. Referring to FIG. 6, the flocculated carbon nanotube film can include a plurality of long, curved, disordered carbon nanotubes entangled with each other. Furthermore, the flocculated carbon nanotube film can be isotropic. The carbon nanotubes can be substantially uniformly dispersed in the carbon nanotube film. Adjacent carbon nanotubes are acted upon by van der Waals attractive force to form an entangled structure with micropores defined therein. Sizes of the micropores can be less than 10 micrometers. The porous nature of the flocculated carbon nanotube film will increase the specific surface area of the carbon nanotube layer 110. Further, due to the carbon nanotubes of the carbon nanotube layer 110 being entangled with each other, the carbon nanotube layer 110 employing the flocculated carbon nanotube film has excellent durability, and can be fashioned into desired shapes with a low risk to the integrity of the carbon nanotube layer 110. The flocculated carbon nanotube film, in some embodiments, is free-standing due to the carbon nanotubes being entangled and adhered together by van der Waals attractive force therebetween.

Figure 7:
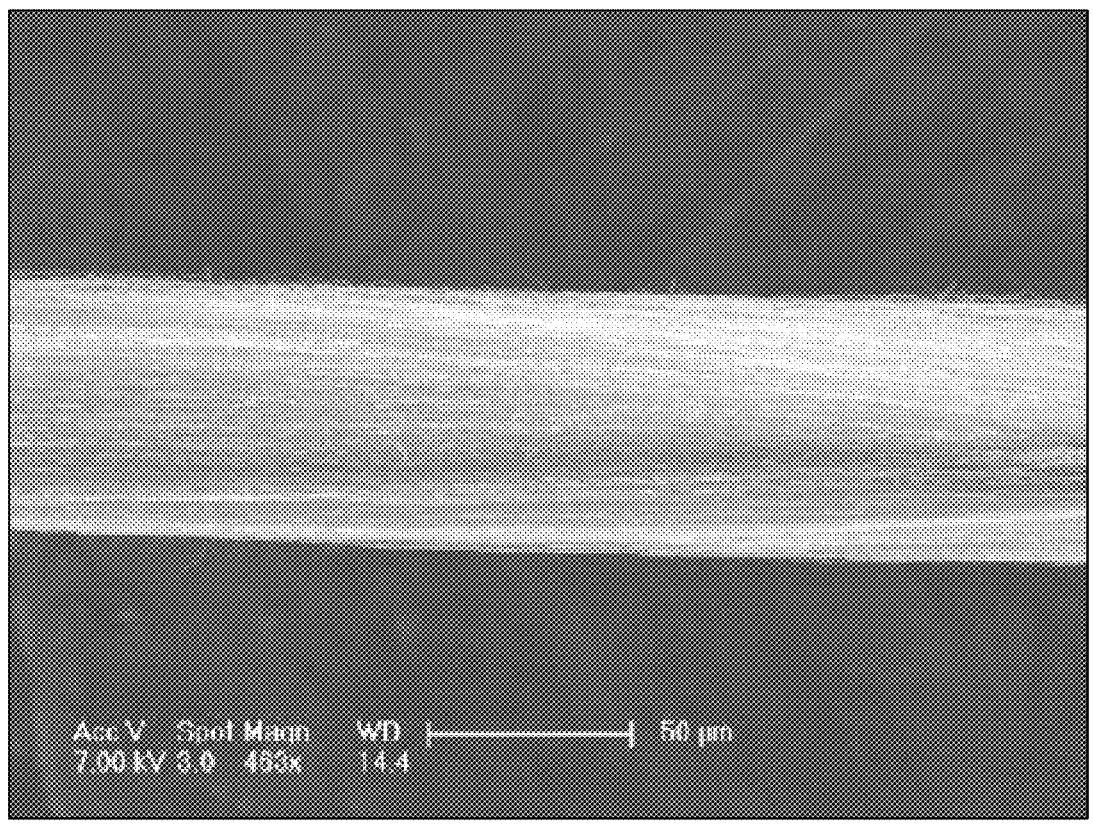
FIG. 7 is an SEM image of one embodiment of an untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent substantially parallel carbon nanotubes in the drawn carbon nanotube film will bundle together, due to the surface tension of the organic solvent as it volatilizes, and thus, the drawn carbon nanotube film will be shrunk into an untwisted carbon nanotube wire. Referring to FIG. 7, the untwisted carbon nanotube wire includes a plurality of carbon nanotubes substantially oriented along a same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nanometers to about 100 micrometers.

Figure 8:
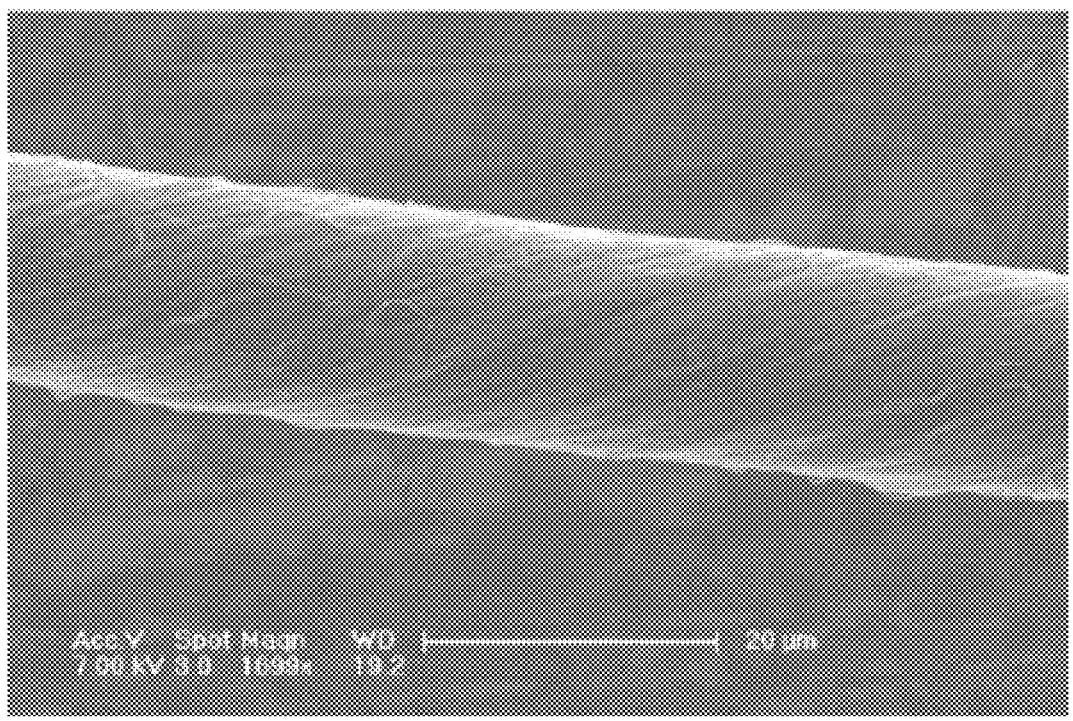
FIG. 8 is an SEM image of one embodiment of a twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 8, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The length of the twisted carbon nanotube wire can be set as desired. A diameter of the twisted carbon nanotube wire can be from about 0.5 nanometers to about 100 micrometers. Further, the twisted carbon nanotube wire can be treated with a volatile organic solvent after being twisted to bundle the adjacent substantially parallel carbon nanotubes together. The specific surface area of the twisted carbon nanotube wire will decrease, while the density and strength of the twisted carbon nanotube wire will increase.

The carbon nanotube layer 110 can be defined as a mask for growing the intrinsic semiconductor layer 104. The mask is the carbon nanotube layer 110 sheltering a part of the first epitaxial growth surface 101 and exposing another part of the first epitaxial growth surface 101. Thus, the intrinsic semiconductor layer 104 can grow from the exposed first epitaxial growth surface 101. The carbon nanotube layer 110 can form a patterned mask on the first epitaxial growth surface 101 because the carbon nanotube layer 110 defines a plurality of apertures 112. Compared to lithography or etching, the method of forming the carbon nanotube layer 110 as the mask is simple, low in cost, and will not contaminate the first epitaxial substrate 100.

It is can be understood that the first epitaxial substrate 100 and the carbon nanotube layer 110 form an epitaxial base to grow the intrinsic semiconductor layer 104 thereon.

In step (13), the intrinsic semiconductor layer 104 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or metal organic chemical vapor deposition (MOCVD).

The intrinsic semiconductor layer 104 is single crystal grown on the first epitaxial growth surface 101 by the method of epitaxial growing. The material of the intrinsic semiconductor layer 104 can be Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. The material of the intrinsic semiconductor layer 104 can be the same as the first epitaxial substrate 100. If the material of the intrinsic semiconductor layer 104 is the same as the first epitaxial substrate 100, intrinsic semiconductor layer 104 is called a homogeneous semiconductor epitaxial layer. If the material of the intrinsic semiconductor layer 104 is not the same as the first epitaxial substrate 100, the intrinsic semiconductor layer 104 is called a heterogeneous semiconductor epitaxial layer.

In detail, a plurality of epitaxial crystal grains 1042 is nucleated on the first epitaxial growth surface 101 and grown along the direction substantially perpendicular to the first epitaxial growth surface 101. The plurality of epitaxial crystal grains 1042 are grown from the exposed a part of the first epitaxial growth surface 101 and through the plurality of apertures 112. The process of the epitaxial crystal grains growing along the direction substantially perpendicular to the first epitaxial growth surface 101 is called vertical epitaxial growth. The epitaxial crystal grains are joined together to form an integral structure to cover the carbon nanotube layer 110. The epitaxial crystal grains are grown and a plurality of grooves 103 is formed to embed the carbon nanotubes of the carbon nanotube layer 110. The inner wall of the plurality of grooves 103 can be contacting the carbon nanotubes or spaced from the carbon nanotubes, if the material of the epitaxial crystal grains and the carbon nanotubes have mutual infiltration. Carbon nanotubes of the carbon nanotube layer 110 are located in each groove 103. The carbon nanotubes in the grooves 103 are joined with each other to form the carbon nanotube layer 110 by van der Waals forces. The grooves 103 extend along the direction substantially parallel to the extending direction of carbon nanotubes of the carbon nanotube layer 110.

Before growing the intrinsic semiconductor layer 104, a buffer layer can be grown on the first epitaxial growth surface 101 (not shown). The material of the buffer layer is selected according to the material of the intrinsic semiconductor layer 104. The lattice mismatch between the first epitaxial substrate 100 and the intrinsic semiconductor layer 104 can be reduced and the quality of the intrinsic semiconductor layer 104 can be improved. In one embodiment, the intrinsic semiconductor layer 104 is grown on the first epitaxial growth surface 101 directly.

In one embodiment, the material of the first epitaxial substrate 100 is GaN, and the intrinsic semiconductor layer 104 is grown on the first epitaxial substrate 100 by a MOCVD method. The nitrogen source gas is high-purity ammonia ($NH_3$), the Ga source gas is trimethyl gallium (TMGa) or triethyl gallium (TEGa), and the carrier gas is hydrogen ($H_2$). A single drawn carbon nanotube film is placed on the epitaxial growth surface 101 of the first epitaxial substrate 100. The growth of the intrinsic semiconductor layer 104 includes the following substeps.

The first step is placing the first epitaxial substrate 100 with the carbon nanotube layer 110 thereon into a reaction chamber and heating the first epitaxial substrate 100 to about 1100° C. to about 1200° C., introducing the carrier gas, and baking the first epitaxial substrate 100 for about 200 seconds to about 1000 seconds.

The second step is introducing the carrier gas atmosphere continuously, keeping the temperature at a range from about 1000° C. to 1100° C. and the gas pressure at a range from about 100 torrs to about 300 torrs, and growing the epitaxial crystal grains 1042 with the thickness of a range from about 10 nm to about 50 nm by introducing the Ga source gas and the nitrogen source gas at the same time. The intrinsic semiconductor layer 104 is formed by the epitaxial crystal grains 1042. The integral structure of the first epitaxial substrate 100, the carbon nanotube layer 110, and the intrinsic semiconductor layer 104 is defined as an epitaxial structure preform.

In step (14), the carbon nanotube layer 110 can be removed by plasma etching, ultrasound, laser heating, or furnace heating. The carbon nanotubes of the carbon nanotube layer 110 are removed by etching or oxidizing.

In one embodiment, the carbon nanotube layer 110 removed by plasma etching includes the following substeps:

step (1401), placing the epitaxial structure preform in a reacting room and creating a vacuum in the reacting room; and step (1402), introducing a reacting gas in the reacting room and producing a plasma of the reacting gas by glow discharge.

In step (1402), the reacting gas can be oxygen gas, hydrogen gas, carbon tetrafluoride gas, or tetrafluoromethane gas. In one embodiment, the reacting gas is oxygen gas and oxygen plasma is produced. The plasma can infiltrate into the grooves 103 to etch the carbon nanotube layer 110. The plasma can react with the carbon nanotube layer 110 from about 15 seconds to about 1 hour. The power of the glow discharge can be in a range from about 20 watts to about 300 watts. The flow of the reacting gas can be in a range from about 10 sccm to about 100 sccm. The gas pressure of the reacting room is about 1 pascal to about 100 pascals. In one embodiment, the reaction time is in a range from about 15 seconds to about 15 minutes, the power of the glow discharge is about 150 watts, and the gas pressure of the reacting room is about 10 Pa.

In one embodiment, the carbon nanotube layer 110 removed by laser heating includes the following substeps:

step (1411), placing the epitaxial structure preform in an oxygen environment; and step (1412), providing a laser beam to irradiate the first epitaxial substrate 100 or the intrinsic semiconductor layer 104.

In step (1412), the laser beam can be provided by a laser device such as a solid laser device, a liquid laser device, a gas laser device, or a semiconductor laser device. In one embodiment, the laser device is a carbon dioxide laser device, the power of the laser device is about 30 watts, the wavelength of the laser is about 10.6 micrometers, the diameter of the laser spot is about 3 millimeters, the power density of the laser is about $0.053 \times 10^{12}$ watts per square meter, and the irradiating time is less than 1.8 second.

The parameter of the laser should be selected according to the material of the intrinsic semiconductor layer 104 so that the intrinsic semiconductor layer 104 will not decompose. For example, if the intrinsic semiconductor layer 104 includes a low-temperature GaN buffer layer and a high-temperature GaN epitaxial layer, the laser with a wavelength of 248 nanometers should not be used to heat and remove the first carbon nanotube layer 110 because the low-temperature GaN buffer layer can absorb the laser with a wavelength of 248 nanometers and decompose to form Ga and $N_2$ easily.

If the first epitaxial substrate 100 is opaque, the first epitaxial substrate 100 will be heated and heat will be conducted to the carbon nanotube layer 110. If the inner wall of the grooves 103 is spaced from the carbon nanotubes of the carbon nanotube layer 110, the grooves 103 can be filled with oxygen gas or air gas. Thus, the carbon nanotube layer 110 is easily oxidized. If the first epitaxial substrate 100 is transparent, the laser can pass through the first epitaxial substrate 100 to irradiate the carbon nanotube layer 110 directly. The carbon nanotube layer 110 can absorb the laser and oxidize easily. The laser beam can be irradiated on the epitaxial structure preform and moved relative to the epitaxial structure preform. The laser beam can be moved along a direction substantially parallel with or substantially perpendicular with the aligning direction of the carbon nanotubes of the carbon nanotube layer 110. The slower the laser beam moves relative to the epitaxial structure preform, the more energy will be absorbed by the carbon nanotube layer 110 and the shorter the time the carbon nanotube layer 110 will oxidize. In one embodiment, the speed of the laser beam moving relative to the epitaxial structure preform is less than 10 millimeters per second.

Step (1412) can be performed by fixing the epitaxial structure preform and moving the laser beam to irradiate the entire first epitaxial substrate 100. Also, step (1412) can be performed by fixing the laser beam and moving the epitaxial structure preform so the entire first epitaxial substrate 100 is irradiated by the laser beam.

In one embodiment, the carbon nanotube layer 110 removed by heating in a furnace includes the following substeps:

step (1421), placing the epitaxial structure preform in a furnace; and step (1422), heating the furnace to a determined temperature.

In step (1421), the furnace can be any furnace according to need. In one embodiment, the furnace is a resistance furnace filled with oxygen gas or air gas.

In step (1422), the furnace is heated to a temperature above 600° C. In one embodiment, the furnace is heated to a temperature in a range from about 650° C. to about 1200° C.

After the carbon nanotube layer 110 is removed, the plurality of grooves 103 are exposed on the second epitaxial substrate 105. The plurality of grooves are substantially parallel to each other or intersected with each other. Thus the surface of the second epitaxial substrate 105 forms a patterned surface. The patterned surface of the second epitaxial substrate 105 relates to the pattern of the carbon nanotube layer 110. The patterned surface is defined as the second epitaxial growth surface to grow the epitaxial layer. Hereafter, the width of the grooves 103 is the size in the direction perpendicular to the extending direction of the grooves 103. The sizes of the grooves 103 can be different. The average size of the grooves 103 can be in a range from about 20 nanometers to about 200 nanometers. In one embodiment, the average size of the grooves 103 ranges from about 50 nanometers to about 100 nanometers.

In step (15), the methods of growing the first semiconductor layer 120, the active layer 130, and the second semiconductor layer 140 are similar to the method of growing the intrinsic semiconductor layer 120. Before growing the first semiconductor layer 120, a buffer layer can grow on the second epitaxial growth surface (not shown). The material of the buffer layer is selected according to the material of the first semiconductor layer 120. The lattice mismatch between the first semiconductor layer 120 and the intrinsic semiconductor layer 104 can be reduced and the quality of the first semiconductor layer 120 can be improved. In one embodiment, the material of the first semiconductor layer 120 is same as the material of the intrinsic semiconductor layer 104. The first semiconductor layer 120 is grown on the first epitaxial growth surface 101 directly. The materials of the active layer 130 and the second semiconductor layer 140 are same as that of the first semiconductor layer 120 to reduce the dislocation defects during the growing process.

The thickness of the first semiconductor layer 120 is selected according to need. The first semiconductor layer 120 is deposited on the intrinsic semiconductor layer 104. The thickness of the first semiconductor layer 120 ranges from about 0.5 nanometers to about 5 micrometers. For example, the thickness of the first semiconductor layer 120 can be about 10 nanometers, about 100 nanometers, about 1 micrometer, about 2 micrometers, or about 3 micrometers. In one embodiment, the first semiconductor layer 120 has a thickness of about 2 micrometers. The first semiconductor layer 120 can be an N-type semiconductor layer or a P-type semiconductor layer. The N-type semiconductor layer can be N-type GaN, N-type GaAs, or N-type $Cu_3P_2$. The P-type semiconductor layer can be P-type GaN, P-type GaAs, or P-type $Cu_3P_2$. The N-type semiconductor layer provides electron mobile site. The P-type semiconductor layer provides hole mobile site. In one embodiment, the first semiconductor layer 120 is an N-type gallium nitride doped with Si.

In one embodiment, the first semiconductor layer 120 is grown on the second epitaxial growth surface by a MOCVD method. The nitrogen source gas is high-purity ammonia ($NH_3$), the Ga source gas is trimethyl gallium (TMGa) or triethyl gallium (TEGa), and the carrier gas is hydrogen ($H_2$). The growth of the first semiconductor layer 120 includes the following substeps:

placing the second epitaxial substrate 105 into a reaction chamber and heating the second epitaxial substrate 105 to about 1100° C. to about 1200° C., introducing the carrier gas, and baking the first epitaxial substrate 100 for about 200 seconds to about 1000 seconds; and introducing the carrier gas, and heating the second epitaxial substrate 105 to about 1000° C. to about 1100° C. for about 30 seconds to about 300 seconds, growing the first semiconductor layer 120 by introducing the Ga source gas and silane gas.

Figure 9:
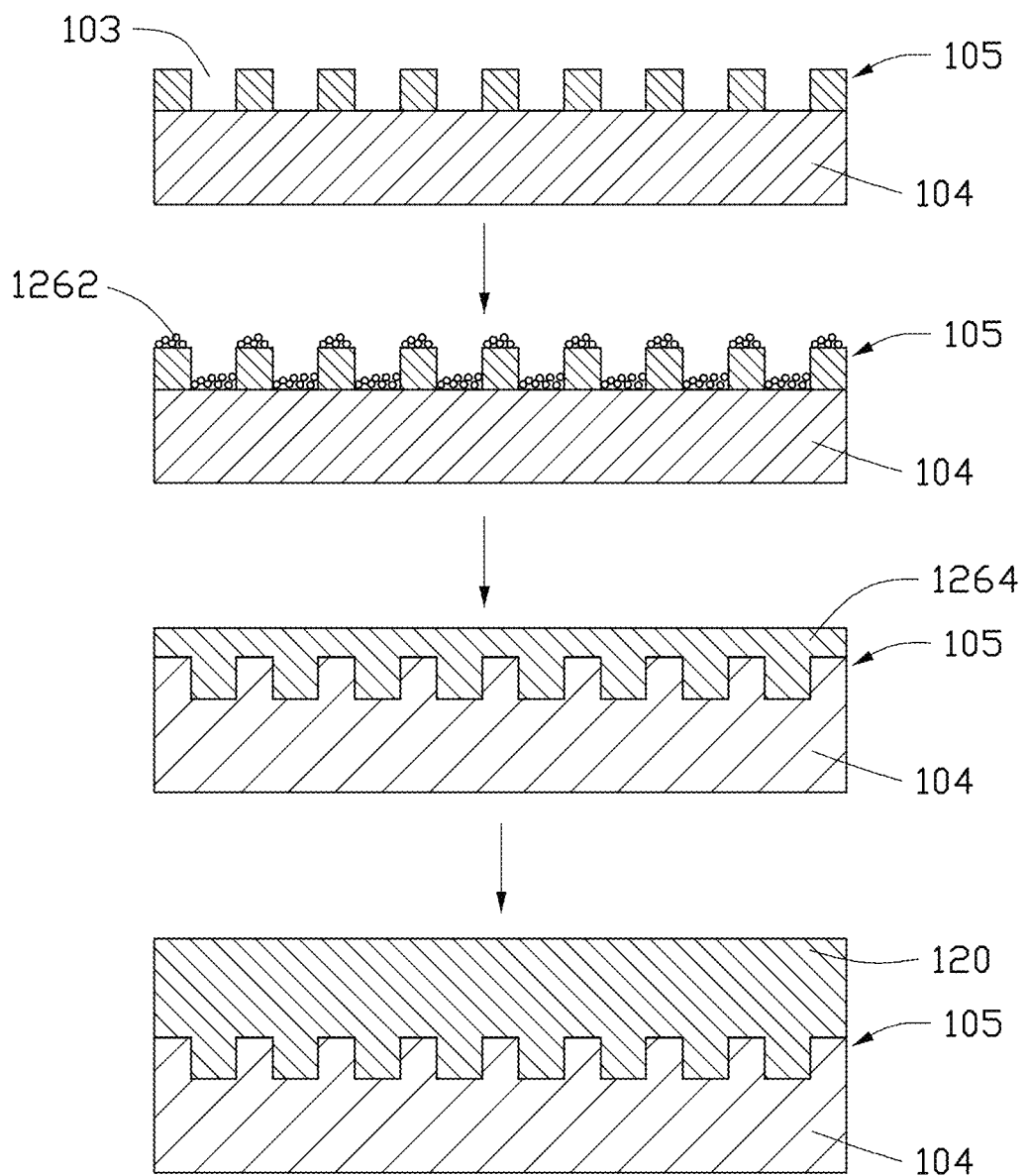
FIG. 9 is a process of growing a first semiconductor layer of the LED fabricated according to the method of FIG. 1.

Referring to FIG. 9, the first semiconductor layer 120 is formed by the following substeps:

step (151), growing a plurality of epitaxial crystal grains 1262 along the direction substantially perpendicular to the first epitaxial growth surface 101 of the first epitaxial substrate 100;

step (152), forming a continuous epitaxial film 1264 by making the plurality of epitaxial crystal grains 1262 grow along the direction substantially parallel to the first epitaxial growth surface 101 of the first epitaxial substrate 100; and step (153), forming the first semiconductor layer 120 by making the epitaxial film 1264 grow along the direction substantially perpendicular to the second epitaxial growth surface of the second epitaxial substrate 105.

In step (151), the epitaxial crystal grains 1262 are grown on the inner wall of the grooves 103 and the surface of the second epitaxial substrate 105 between the grooves 103. The growth speed of the epitaxial crystal grains 1262 according to the grooves 103 is greater than that of other part surface. Thus the epitaxial crystal grains 1262 will be fully filled in the grooves 103 and form a planar surface.

In step (152), the epitaxial crystal grains 1262 are joined together to form an integral structure (the epitaxial film 1264) to cover the grooves 103.

In step (153), the first semiconductor layer 120 is obtained by growing for a long duration of time.

The thickness of the active layer 130 ranges from about 0.01 micrometers to about 0.6 micrometers. The active layer 130 is a photon excitation layer and can be one of a single layer quantum well film or multilayer quantum well films. The active layer 130 is made of GaInN, AlGaInN, GaSn, AlGaSn, GaInP, or GaInSn. In one embodiment, the active layer 130 has a thickness of about 0.3 micrometers and includes one layer of GaInN and another layer of GaN. The GaInN layer is stacked with the GaN layer. The growth method of the active layer 130 is similar to the first semiconductor layer 120. In one embodiment, the indium source gas is trimethyl indium. The growth of the active layer 130 after the growth of the first semiconductor layer 120 includes the following steps:

(a1) stopping the flow of the Si source gas and maintaining the temperature of the reaction chamber in a range from about 700° C. to about 900° C., and the pressure of the reaction chamber ranges from about 50 torrs to about 500 torrs; and (a2) introducing the indium source gas, growing an InGaN/GaN multilayer quantum well film to form the active layer 130.

The thickness of the second semiconductor layer 140 ranges from about 0.1 micrometers to about 3 micrometers. The second semiconductor layer 140 can be an N-type semiconductor layer or a P-type semiconductor layer. Furthermore, the type of the second semiconductor layer 140 is different from the type of the first semiconductor layer 120. A surface of the second semiconductor layer 140 is defined as an extraction surface of the LED. In one embodiment, the second semiconductor layer 140 is a P-type gallium nitride doped with Mg. The thickness of the second semiconductor layer 140 is about 0.3 micrometers. The growth of the second semiconductor layer 140 is similar to the first semiconductor layer 120. The second semiconductor 140 is grown after the growth of the active layer 130. In one embodiment, the Mg source gas is ferrocene magnesium ($Cp_2Mg$), and the method includes the following steps:

(b1) stopping the flow of the indium source gas and maintaining the temperature of the reaction chamber in a range from about 1000° C. to about 1100° C., and maintaining the pressure of the reaction chamber to a range from about 76 torrs to about 200 tons; and (b2) growing P-type gallium nitride doped with Mg to form the second semiconductor layer 140 by introducing the Mg source gas.

In step (16), a part of the active layer 130 and the second semiconductor layer 140 is etched via a process of reactive ion etching. The second epitaxial substrate 105, the first semiconductor layer 120, the active layer 130 and the second semiconductor layer 140 can form an LED preform. In one embodiment, a part of the active layer 130 and the second semiconductor layer 140 are etched via a process of reactive ion etching, and the process including:

step (161), coating a layer of photo resist on the top surface of the second semiconductor layer 140;

step (162), removing a portion of the photo resist to expose the second semiconductor layer 140;

step (163), placing the LED preform in an inductively coupled plasma system; and step (164), removing the exposed second semiconductor layer 140 and the active layer 130 and exposing the first semiconductor layer 120 using silicon tetrachloride and chlorine as the etching gas.

In one embodiment, the power of the plasma system is about 50 watts, the input rate of chlorine is about 26 sccm, the input rate of silicon tetrachloride is about 4 sccm, and the air pressure is about 2 Pa, etching about 0.3 micrometers of the second semiconductor layer 140 and about 0.3 micrometers of the active layer 130.

In step (17), the first electrode 150 is located and contacted on a region of the surface of the first semiconductor layer 120. The first electrode 150 can be an N-type electrode or P-type electrode, and the type of the first electrode 150 is the same as the first semiconductor layer 120. The first electrode 150 can be a single layer structure or a multi-layer structure. The material of the first electrode 150 can be titanium (Ti), silver (Ag), aluminum (Al), nickel (Ni), gold (Au), or any combination thereof. The material of the first electrode 150 can also be indium-tin oxide (ITO). The thickness of the first electrode 150 ranges from about 0.01 micrometers to about 2 micrometers. In one embodiment, the first electrode 150 is an N-type electrode and located on one side of the first semiconductor layer 120. The first electrode 150 is a two-layer structure consisting of a Ti layer with a thickness of about 15 nanometers and an Au layer with a thickness of about 100 nanometers.

The second electrode 160 is located and contacted on a region of the surface of the second semiconductor layer 140. The surface of the second semiconductor layer 140 is the extraction surface of the LED. The shape and the location of the second electrode 160 hardly affect the light extraction of the LED. The second electrode 160 can be an N-type electrode or P-type electrode, and the type of the second electrode 160 is the same as the second semiconductor layer 140. The second electrode 160 can be a single layer structure or a multi-layer structure. The material of the second electrode 160 can be selected from titanium (Ti), silver (Ag), aluminum (Al), nickel (Ni), gold (Au), or any combination thereof. The material of the second electrode 160 can also be indium-tin oxide (ITO). The thickness of the second electrode 160 ranges from about 0.01 micrometers to about 2 micrometers. In one embodiment, the second electrode 160 is an N-type electrode and located on one side of the second semiconductor layer 140. The second electrode 160 is a two-layer structure consisting of a Ti layer with a thickness of about 15 nanometers and an Au layer with a thickness of about 100 nanometers.

The first electrode 150 and the second electrode 160 are formed at the same time. The first electrode 150 and the second electrode 160 are prepared via a process of physical vapor deposition (PVD), such as electron beam evaporation, vacuum evaporation, ion sputtering, or physical deposition. In one embodiment, the first electrode 150 and the second electrode 160 prepared via a physical deposition method. The method includes:

step (171), coating a layer of photo resist on the surface of the second semiconductor layer 140 and the exposed surface of the first semiconductor layer 120;

step (172), removing a portion of the photo resist to expose a part of the second semiconductor layer 140 and the first semiconductor layer 120;

step (173), depositing the first electrode 150 on the surface of the first semiconductor layer 120 where the layer of photo resist has been removed, depositing the second electrode 160 on the surface of the second semiconductor layer 140 where the layer of photo resist has been removed; and step (174), removing the residual photo resist via an organic solvent, such as acetone to form the first electrode 150 and the second electrode 160.

The method for making the light emitting diode has many advantages. First, the carbon nanotube layer is a continuous and free-standing structure, and it can be directly placed on the first epitaxial substrate to grow the intrinsic semiconductor layer, so the complex sputtering process is avoided. Second, because the apertures defined by the carbon nanotube layer are very small, the dislocation defects of the first semiconductor layer will be reduced. Third, because carbon nanotubes of the carbon nanotube layer are nanometer scale, the apertures defined by the carbon nanotube layer can also be nanometer scale, and thus the LED has a high light extraction. The words "nanometer scale" means the diameter of the carbon nanotubes or the size of the apertures is less than 100 nanometers. Fourth, because the intrinsic semiconductor has less dislocation defects and the second epitaxial growth surface of the second epitaxial substrate is a pattern, the contacting surface and the strain between the intrinsic semiconductor layer and the first semiconductor layer are reduced. Lastly, the intrinsic semiconductor layer is grown homogeneously on the first epitaxial substrate to form a patterned surface, and the patterned surface is used to grow the first semiconductor layer, thus the dislocation defects will be further reduced in the process of growing the first semiconductor layer.

A method for making a LED of another embodiment includes the following steps:

step (21), providing a first epitaxial substrate having a first epitaxial growth surface;

step (22), placing a carbon nanotube layer on the first epitaxial growth surface of the first epitaxial substrate;

step (23), epitaxially growing a low-temperature GaN layer on the first epitaxial growth surface, wherein the low-temperature GaN layer is a discontinuous epitaxial layer comprising a plurality of nanostructures spaced from each other;

step (24), forming a second epitaxial substrate by removing the carbon nanotube layer, wherein the second epitaxial substrate has a patterned surface defined as a second epitaxial growth surface;

step (25), growing a N-type GaN layer, an InGaN/GaN layer and a P-type GaN layer on the second epitaxial growth surface in that order, wherein a surface of the N-type GaN layer contacting the second epitaxial substrate is patterned and engages the second epitaxial growth surface of the second epitaxial substrate;

step (26), exposing a part of the N-type GaN layer by etching a part of the InGaN/GaN layer and the P-type GaN layer; and step (27), applying a first electrode on the N-type GaN layer and applying a second electrode on the P-type GaN layer.

In step (23), the low-temperature GaN layer can be grown by the same method of the intrinsic semiconductor layer in one embodiment. The material of the low-temperature GaN layer is the same as the material of the first epitaxial substrate 100 to reduce the dislocation defects during the growing process.

In another embodiment, the substrate is sapphire, and the buffer layer is grown on the sapphire substrate by a MOCVD method. The nitrogen source gas is high-purity ammonia ($NH_3$), the Ga source gas is trimethyl gallium (TMGa) or triethyl gallium (TEGa), and the carrier gas is hydrogen ($H_2$). A single drawn carbon nanotube film is placed on an epitaxial growth surface of the sapphire substrate. The method of making the buffer layer includes the following steps:

step (a), locating the sapphire substrate into a reaction chamber, heating the sapphire substrate to about 1100° C. to about 1200° C., introducing the carrier gas, and baking the sapphire substrate for about 200 seconds to about 1000 seconds; and step (b), growing a low-temperature GaN buffer layer by cooling down the temperature of the reaction chamber to a range from about 500° C. to 650° C. in the carrier gas atmosphere, and introducing the Ga source gas and the nitrogen source gas at the same time.

The lattice mismatch between the substrate and the N-type GaN layer can be reduced by the buffer layer, thus, the quality of the N-type GaN layer can be improved.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making a light emitting diode, the method comprising:

providing a first epitaxial substrate having a first epitaxial growth surface;

placing a carbon nanotube layer on the first epitaxial growth surface of the first epitaxial substrate;

epitaxially growing an intrinsic semiconductor layer on the first epitaxial growth surface, wherein the intrinsic semiconductor layer is a discontinuous epitaxial layer comprising a plurality of nanostructures spaced from each other;

forming a second epitaxial substrate by removing the carbon nanotube layer, wherein the second epitaxial substrate has a patterned surface defined as a second epitaxial growth surface;

growing a first semiconductor layer, an active layer and a second semiconductor layer on the second epitaxial growth surface in that order, wherein a surface of the first semiconductor layer contacting the second epitaxial substrate is patterned and engaged with the second epitaxial growth surface of the second epitaxial substrate;

exposing a part of the first semiconductor layer by etching a part of the active layer and the second semiconductor layer; and applying a first electrode on the first semiconductor layer and applying a second electrode on the second semiconductor layer.

2. The method of claim 1, wherein the carbon nanotube layer is free-standing and placed on the first epitaxial growth surface directly.

3. The method of claim 2, wherein the carbon nanotube layer comprises a plurality of carbon nanotubes and the plurality of nanostructures are spaced from each other by the plurality of carbon nanotubes of the carbon nanotube layer.

4. The method of claim 3, wherein the plurality of carbon nanotubes of the carbon nanotube layer are arranged along a direction substantially parallel to the first epitaxial growth surface.

5. The method of claim 2, wherein a plurality of apertures is defined by the carbon nanotube layer, and the intrinsic semiconductor layer is epitaxial grown through the plurality of apertures.

6. The method of claim 5, wherein part of the first epitaxial growth surface is exposed from the plurality of apertures, and the first semiconductor layer is grown on the part of the first epitaxial growth surface that is exposed from the plurality of apertures.

7. The method of claim 1, wherein the carbon nanotube layer is formed by attaching a carbon nanotube film or a plurality of carbon nanotube wires on the first epitaxial growth surface directly.

8. The method of claim 1, wherein a plurality of epitaxial crystal grains is grown along a direction substantially perpendicular to the first epitaxial growth surface to form the plurality of nanostructures.

9. The method of claim 1, wherein the carbon nanotube layer is treated with an organic solvent after being placed on the first epitaxial growth surface.

10. The method of claim 1, wherein a plurality of grooves is defined by the intrinsic semiconductor layer, and carbon nanotubes of the carbon nanotube layer are embedded in the plurality of grooves.

11. The method of claim 10, wherein the plurality of grooves are substantially parallel to each other or intersected with each other.

12. The method of claim 11, wherein the first semiconductor layer is grown by:

growing a plurality of epitaxial crystal grains along a direction substantially perpendicular to the first epitaxial growth surface of the first epitaxial substrate, and the epitaxial crystal grains are fully filled in the grooves;

forming a continuous epitaxial film by making the plurality of epitaxial crystal grains grow along a direction substantially parallel to the first epitaxial growth surface of the first epitaxial substrate; and forming the first semiconductor layer by making the epitaxial film grow along the direction substantially perpendicular to the second epitaxial growth surface of the second epitaxial substrate.

13. The method of claim 1, wherein a buffer layer is grown on the first epitaxial growth surface before growing the intrinsic semiconductor layer.

14. The method of claim 13, wherein a thickness of the carbon nanotube layer is greater than a thickness of the buffer layer.

15. The method of claim 1, wherein the carbon nanotube layer is removed by plasma etching, ultrasound, laser heating, or furnace heating.

16. The method of claim 15, wherein the carbon nanotube layer is removed by laser heating using a laser beam, the laser beam has a wavelength of about 10.6 micrometers, a power of about 30 watts, and a shape of a laser spot of the laser beam is square with a side length of about 3 millimeters.

17. A method for making a light emitting diode, the method comprising:
- providing a first epitaxial substrate having a first epitaxial growth surface;
- placing a carbon nanotube layer on the first epitaxial growth surface of the first epitaxial substrate;
- epitaxially growing a low-temperature GaN layer on the first epitaxial growth surface, wherein the Low-temperature GaN layer is a discontinuous epitaxial layer comprising a plurality of nanostructures spaced from each other;
- forming a second epitaxial substrate by removing the carbon nanotube layer, wherein the second epitaxial substrate has a patterned surface defined as a second epitaxial growth surface;
- growing a N-type GaN layer, an InGaN/GaN layer and a P-type GaN layer on the second epitaxial growth surface in that order, wherein a surface of the N-type GaN layer contacting the second epitaxial substrate is patterned and engages the second epitaxial growth surface of the second epitaxial substrate;
- exposing a part of the N-type GaN layer by etching a part of the InGaN/GaN layer and the P-type GaN layer; and
- applying a first electrode on the N-type GaN layer and applying a second electrode on the P-type GaN layer.

* * * * *